United States Patent
Takeda et al.

(10) Patent No.: US 7,863,904 B2
(45) Date of Patent: Jan. 4, 2011

(54) CELL VOLTAGE DETECTION DEVICE AND CELL SYSTEM USING THE SAME

(75) Inventors: Kenji Takeda, Hitachi (JP); Hironari Kawazoe, Hitachi (JP); Motoo Futami, Hitachiota (JP); Masahiro Komachiya, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 1104 days.

(21) Appl. No.: 11/526,650

(22) Filed: Sep. 26, 2006

(65) Prior Publication Data
US 2007/0202371 A1 Aug. 30, 2007

(30) Foreign Application Priority Data
Feb. 28, 2006 (JP) .............................. 2006-051464

(51) Int. Cl.
*G01N 27/416* (2006.01)
(52) U.S. Cl. ...................... 324/522; 324/433; 320/116; 320/120
(58) Field of Classification Search ................. 324/522, 324/426, 433; 320/116, 120
See application file for complete search history.

(56) References Cited

U.S. PATENT DOCUMENTS
2002/0196025 A1* 12/2002 Freeman et al. ............. 324/426

FOREIGN PATENT DOCUMENTS
JP 2003-243044 8/2003

* cited by examiner

*Primary Examiner*—Vincent Q Nguyen
(74) *Attorney, Agent, or Firm*—Antonelli, Terry, Stout & Kraus, LLP.

(57) ABSTRACT

A fuel cell detection device according to the present invention includes: a cell block formed with a plurality of cells serially connected to each other; a voltage detection element for detecting voltages of the cells within the cell block; and another voltage detection element for detecting a voltage of the operating power source of the voltage detection element, where the operating power source of the voltage detection element is supplied from a voltage of the inside or both ends of the cell block, and the operating power source of another voltage detection element is supplied from a voltage of the outside of the cell block, the operating power source of another voltage detection element being less variable than the operating power source of the voltage detection element.

13 Claims, 7 Drawing Sheets

CELL VOLTAGE DETECTION DEVICE AND CELL SYSTEM USING THE SAME

CLAIM OF PRIORITY

The present application claims priority from Japanese application No. 2006-051464, filed on Feb. 28, 2006, the content of which is hereby incorporated by reference into this application.

BACKGROUND OF THE INVENTION

1. Field of the Invention

The present invention relates to a cell voltage detection device for detecting voltages of fuel cells of a fuel battery stack formed with a plurality of fuel cells serially connected to each other, and to the cell system using a cell voltage detection device.

2. Description of the Prior Art

Recently, fuel cells have been considered as an energy source with reduced environmental load. For example, the use of a polymer electrolyte fuel cell (PEFC) has been studied as an energy source of a cogeneration system using its heat and electric power or as a power source of an electric vehicle.

The fuel cell is a device that obtains electromotive force by electrochemically reacting the fuel gas containing hydrogen as a major component and the oxidant gas. The electromotive force of each fuel cell is at most only about 0.7 V. Thus, it is generally used a single fuel cell stack formed by laminating a dozen to hundreds of cells. The voltages of the stacked fuel cells vary depending on the distributions of fuel gas density, humidity and temperature within the stack, so that the voltage degradation tendency is different for each cell. As the reduction of each cell voltage is likely to have an effect on the life and safety of the stack, it is necessary to monitor the state of each cell voltage. As an example of the cell voltage detection device for detecting each of the voltages of the serially connected cells, a method for detecting the cell voltage of a secondary cell using an A/D converter element is disclosed, for example, in Japanese Patent Laid-open No. 2003-243044.

In order to operate the A/D converter element, it is necessary to supply a predetermined operating power source and a reference voltage for A/D conversion, to the A/D converter element. Here, the operating power source and the reference voltage are supplied using a part of the power of the cell whose voltage is to be measured. In this way, a device for externally supplying power can be eliminated. The secondary cell such as an Li-Ion cell can keep the cell voltage within a desired variation range by adjustment of the charge/discharge amount, if the self-discharge is ignored.

SUMMARY OF THE INVENTION

In the fuel cell, however, when compared to the Li-Ion cell and the like, the cell voltage is zero with no fuel gas supplied, and the cell voltage during the fuel supply is likely to vary depending on the state of the fuel cell. Because of this feature, in the case where the operating power source of an A/D converter element and the reference voltage for A/D conversion are supplied from the voltage of the fuel cell, a false detection of detection data of the A/D converter element may occur when a plurality of cell voltages decrease at the same time.

The present invention addresses the above identified problem and is intended to provide a cell voltage detection device capable of detecting the-false detection of detection data upon use of the A/D converter element for the measurement of the cell voltage.

A cell voltage detection device according to the invention includes: a voltage detection element A for detecting cell voltages within a cell block formed with a plurality of cells serially connected to each other; and a voltage detection element B for detecting an operating power source voltage of the voltage detection element A, where the operation voltage of the voltage detection element A is supplied from a voltage of the inside or both ends of the cell block, and the operating power source of the voltage detection element B is supplied from a voltage of the outside of the cell block. The power source used for the voltage detection element B is less variable than the operating power source of the voltage detection element A.

According to the present invention, it is possible to provide a cell voltage detection device capable of preventing the false detection of cell voltage detection data.

DESCRIPTION OF THE PREFERRED EMBODIMENTS

Hereinafter, details of the present invention will be described with reference to accompanying drawings.

Embodiment 1

Figure 1:
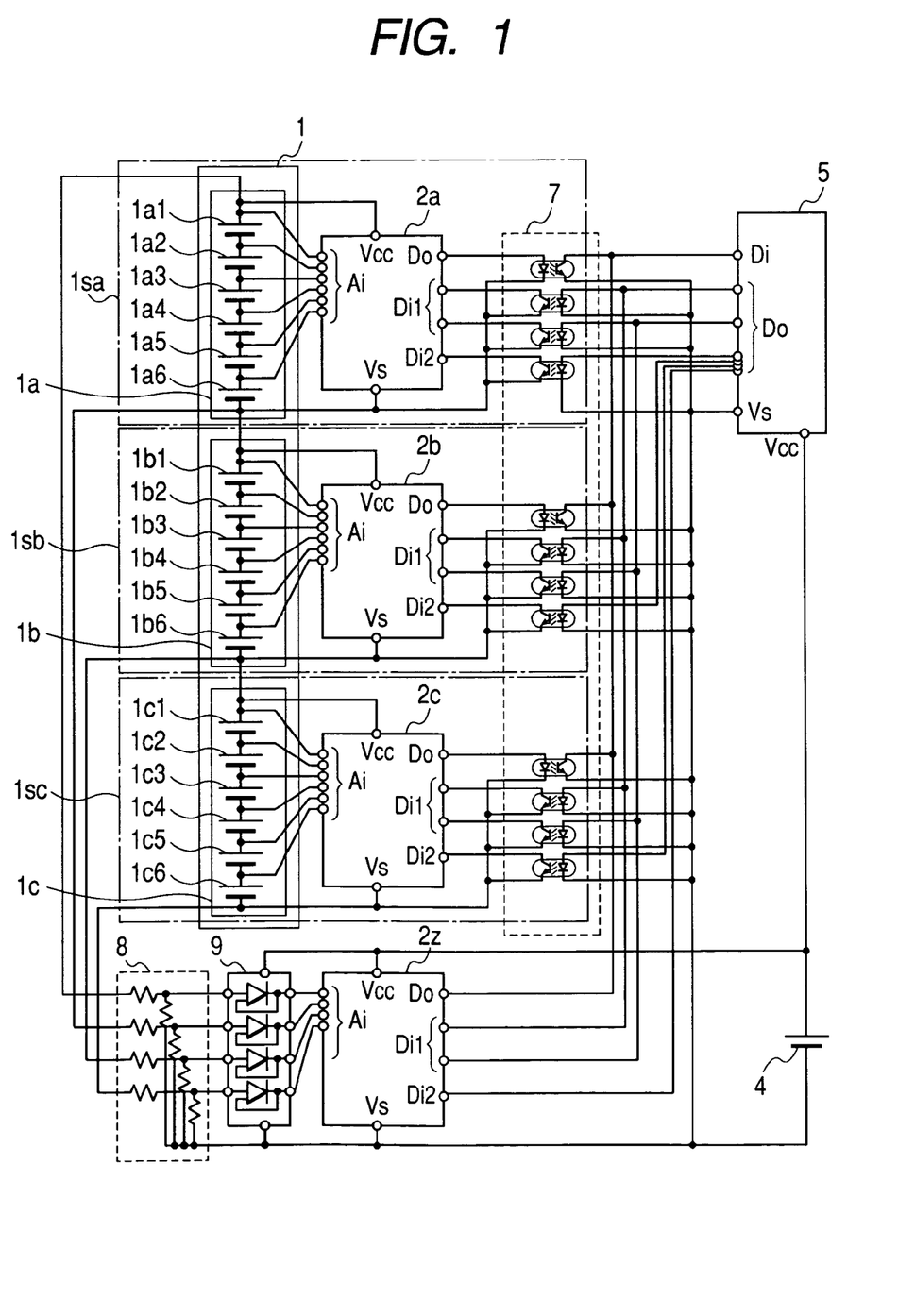
FIG. 1 is a diagram showing the outline of a cell voltage detection device according to Embodiment 1.

The embodiment will be described with reference to FIG. 1. Fuel cells $1a1$, $1a2$, $1a3$, $1a4$, $1a5$, $1a6$ shown in FIG. 1 are connected in series so that the fuel cell of the smaller numeral has a higher potential, forming a fuel cell block $1a$. Similarly, fuel cells $1b1$ to $1b6$ and $1c1$ to $1c6$ respectively form fuel cell blocks $1b$, $1c$. Further, fuel cell blocks $1a$, $1b$, $1c$ are connected in series so that the fuel cell block of the smaller numeral has a higher potential, forming a fuel cell stack 1. Here, the configuration where the fuel cells are laminated via a separator may be considered as a series connection of the fuel cells or fuel cell blocks. In FIG. 1, the six fuel cells within the fuel cell block are connected in series and the three fuel cell blocks within the fuel cell stack are connected in series. However, it may be configured that other plural number of fuel cells and blocks are connected in series.

Connected to the fuel cell blocks $1a$, $1b$, $1c$ are A/D converter elements $2a$, $2b$, $2c$ as a voltage detection element A, respectively. Each of the fuel cell blocks $1a$, $1b$, $1c$, which is formed by the six serially connected fuel cells, generates six voltages by the electromotive force of the fuel cells relative to the minimum potentials, respectively. The six voltages generated in each of the fuel cell blocks are all connected to an analog input terminal Ai of each of the A/D converter elements $2a$, $2b$, $2c$. Of the potentials generated within each of the fuel cell blocks $1a$, $1b$, $1c$, the maximum potential point is connected to a power source terminal Vcc of each of the A/D converter elements $2a$, $2b$, $2c$, and the minimum potential point is connected to a ground potential terminal Vs of each of the A/D converter elements $2a$, $2b$, $2c$.

Further, the maximum and minimum potentials of the serially connected cells forming the fuel cell blocks $1a$, $1b$, $1c$, respectively, are connected to an analog input terminal Ai of an A/D converter element $2z$ as another voltage detection element B, via a voltage dividing resistance circuit 8 and a buffer circuit 9 and the like. A power source terminal Vcc of the A/D converter element $2z$ is supplied with an output of a constant voltage source 4 that supplies a voltage less variable than the voltage at both ends of each of the fuel cell blocks. Here, for example, a three-terminal regulator element or a switching converter circuit may be used for the constant voltage source 4. Here, the both end voltage may be used for the power supply of the constant voltage source 4, as it can be considered that there is little effect on the both end voltage of the fuel cell stack 1 if some of the cell voltages decrease due to more number of serially connected cells in the fuel cell stack 1 than in each fuel cell block.

In the embodiment, a processor 5 such as a microcomputer is used for data communication with the A/D converter element and for collection of voltage data. Here, for example, assuming that serial or parallel digital communication is used for the data communication, where a port capable of generating a digital signal of A/D conversion command data is assigned to pins of a digital output Do of the processor 5, and pins of digital input Di1 and digital input Di2 of each of the A/D converter elements $2a$, $2b$, $2c$, $2z$ are connected thereto. Further, a port capable of receiving a digital signal of A/D conversion result data is assigned to a digital input Di of the processor 5, and a pin of the digital output Do of each of the A/D converter elements $2a$, $2b$, $2c$, $2z$ is connected thereto.

It is assumed that for the connections of the digital output Do and digital inputs Di1, Di2 of each A/D converter element, the digital ground potential of the A/D converter element and the ground potential of the processor 5 are mutually converted by insulation means, according to the necessity. An optical or magnetic coupler may be used for the insulation means 7. Further, an output voltage of the constant voltage source 4 may be connected to the operating power source Vcc of the processor 5. This configuration allows the power supply of the processor 5 and the A/D converter element $2z$ with a single power source, so that the number of power source circuits can be reduced. It is also possible to reduce the power source circuits in such a way that one of the A/D converter elements $2a$, $2b$, $2c$ has the operating power source Vcc common to the processor 5 and the A/D converter element $2z$.

In the configuration of FIG. 1, parts of the A/D converter elements and insulation means 7 are defined as cell submodules which are respectively indicated by symbols $1sa$, $1sb$, $1sc$ in the figure. The minimum potentials of the cell blocks within the plurality of cell submodules are different from each other, where it is configured to perform the measurement of the potentials at the both ends of the fuel cell blocks by the A/D converter $2z$, the communication via the insulation means 7 and the driving of the processor 5, using the common constant voltage source 4.

Because of this configuration, the processor 5 can collect voltage values of any analog input Ai, which are converted to A/D conversion result data, by transmitting a predetermined A/D conversion command data to the A/D converter elements $2a$, $2b$, $2c$, $2z$. Further, as shown in FIG. 1, when the communication is performed in the single processor 5 with the plurality of A/D converter elements using the same digital communication protocol, the signal paths of the A/D conversion command data and A/D conversion result data are electrically connected in parallel on the side closer to the processor 5 than the insulation means 7. However, in this case, the same digital signals are transmitted from the processor 5 to Di1 of all the A/D converter elements. In order to obtain the result data of a desired A/D converter element of the plurality of A/D converter elements, a signal (chip select) designating the A/D converter element to receive the signal is transmitted only to the input terminal Di2 of the desired A/D converter element. With such a configuration, the processor 5 can transmit/receive the digital communication with the plurality of A/D converter elements through a single communication port, allowing reduction of the number of pins having the communication function of the processor 5. Although the digital communication protocol for transmitting/receiving the chip select through a specific port has been exemplified for the digital communication protocol between the A/D converter element and the processor 5, it may be configured in accordance with other communication protocols, such as performing the chip select by a bit within the digital signal.

Figure 2:
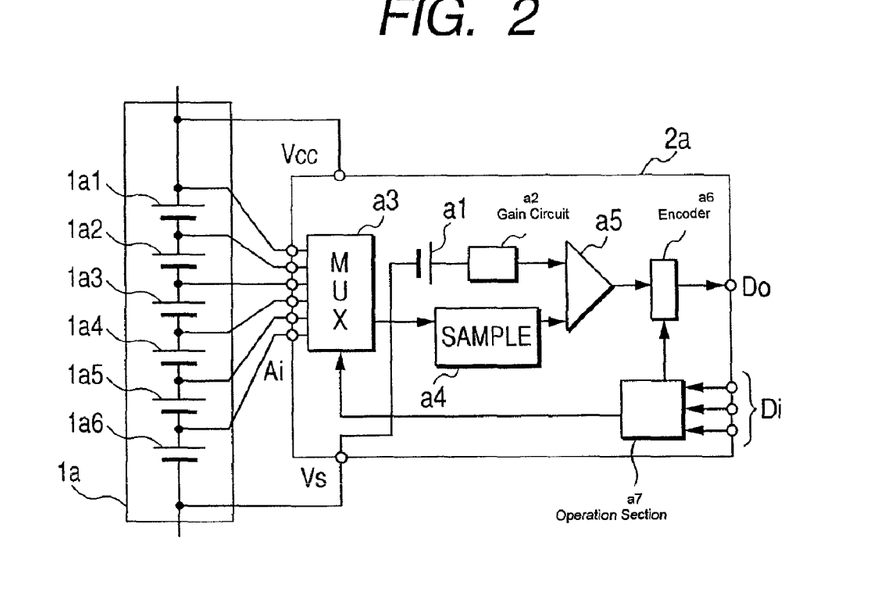
FIG. 2 is a diagram showing an example of an A/D converter element periphery in the cell voltage detection device according to Embodiment 1.

FIG. 2 shows a detailed diagram of an A/D converter element, taking an example of the A/D converter element $2a$ connected to the fuel cell block $1a$. Inside the A/D converter element, there is generated a reference voltage $a1$ using a band gap reference and the like, based on the operating power source supplied between the power source terminal Vcc and the ground potential terminal Vs. A signal operation section $a7$ outputs command signals to a multiplexer circuit $a3$ and an encoder $a6$, based on the digital command signals including the chip select for the digital input terminal Di and the serial clock. In response to the output command signals, the multiplexer circuit $a3$ selects a desired analog input terminal Ai, and a sample hold circuit $a4$ holds a selected terminal voltage. A comparator $a5$ compares an output voltage of the sample hold circuit $a4$ to the voltage of a reference voltage $a1$ and to a reference voltage generated in a gain circuit $a2$, which is changed over time. Then the comparator $a5$ measures the condition which is identical in the both voltages, for example, time, using a counter or other instrument. The encoder $a6$ causes the Do terminal to generate a predetermined digital signal, based on the digital value such as the counter number to realize the condition measured in the comparator $a5$.

Figure 3:
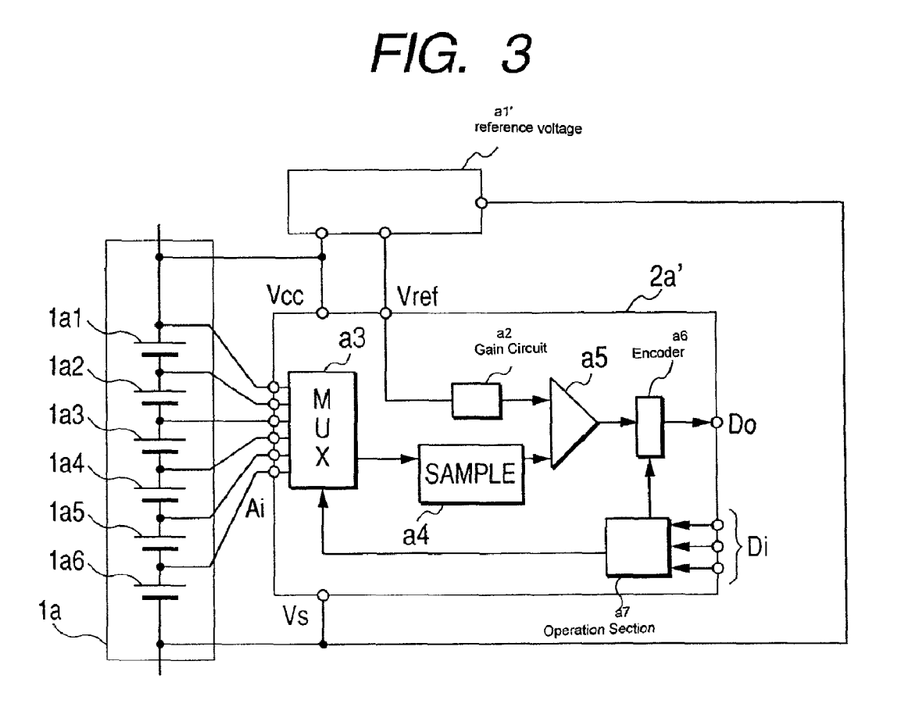
FIG. 3 is a diagram showing an example of another A/D converter element periphery in the cell voltage detection device according to Embodiment 1.

FIG. 3 shows a configuration example of an A/D converter element $2a'$, which is different from FIGS. 1 and 2. In FIG. 2, the reference voltage $a1$ generated within the A/D converter element $2a$ was used. However, as shown in FIG. 3, the input reference voltage of the comparator $a5$ may be defined in such a way that a less variable reference voltage is connected to a reference voltage terminal Vref of the A/D converter element $2a'$ using a reference voltage element $a1'$ as an external circuit of the A/D converter element $2a'$.

Figure 4:
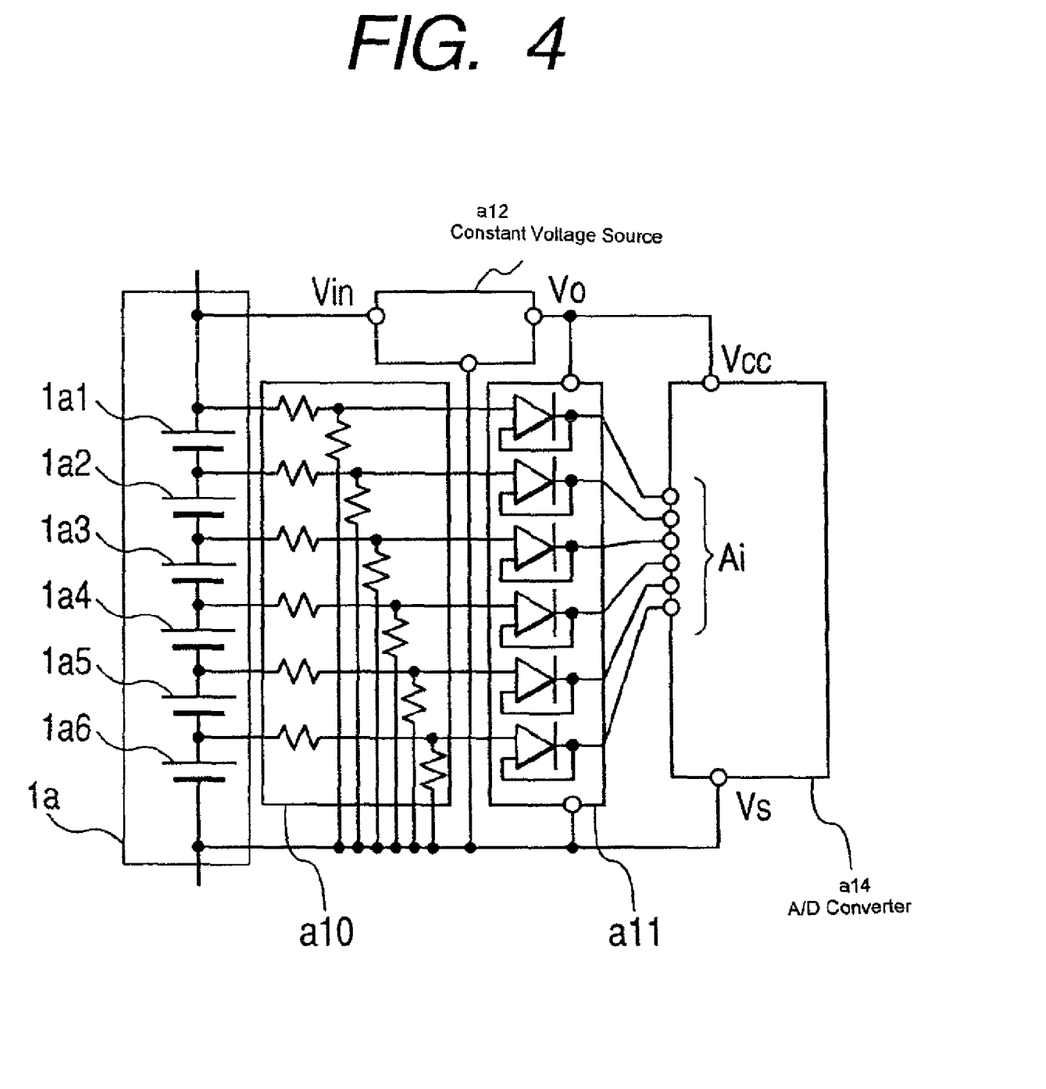
FIG. 4 is a diagram showing a connection example of another A/D converter element in the cell voltage detection device according to Embodiment 1.

FIG. 4 shows a connection example of the fuel cell block a1 and the A/D converter element 2a with the both end voltage of the fuel cell block 1a exceeding the maximum rating of supply voltage of the A/D converter element 2a. In this case, a constant voltage source a12 is provided so that the output voltage is below the withstand voltage of the A/D converter element 2a, thereby the both end voltage of the fuel cell block 1a is supplied to an input Vin of the constant voltage source a12. Between the cell potential within the fuel cell block 1a and the analog input terminal Ai of the A/D converter element 2a, there are provided a predetermined voltage dividing resistance circuit a10 and a buffer circuit a11, to prevent the supply of the voltage exceeding the output voltage of the constant voltage source a12 to the input Ai of the A/D converter element 2a. When the A/D converter elements as the voltage detection element A are connected using the configuration of FIG. 4, the voltage of the operating power source of the voltage detection element A, which is detected in the A/D converter element 2z as the voltage detection element B, can be obtained by detecting the potentials at the both ends of the fuel cell block 1a, in addition to the potentials at the both ends of the constant voltage source a12.

Here, the description will be made on a case where the polymer electrolyte fuel cell (PEFC) is used for the fuel cells 1a1 to 1a6, 1b1 to 1b6, and 1c1 to 1c6. The PEFC type of fuel cell can generate a voltage of about 0.7 to 1.0 V per cell by circulating the hydrogen-rich gas as the fuel gas. However, in the fuel cell during power generation, the reaction that hydrogen is oxidized to generate water is performed, where excessive moistening within the fuel cell may block the circulation of the fuel gas and oxidation gas, sometimes causing the operation to run out of gas. When the operation runs out of gas, the performance of the fuel cell is degraded, and the cell voltage decreases sometimes to around 0 V.

Accordingly, for example, in the case where the voltages of many of the six fuel cells forming the fuel cell block 1a decrease at the same time, the voltage between the operating power source terminal Vcc of the A/D converter element 2a and the ground potential terminal Vs also decreases. The operation voltage of the A/D converter element 2a is below the acceptable value, and an abnormal value may appear in the A/D conversion result data transmitted from the A/D converter element 2a.

Figure 5:
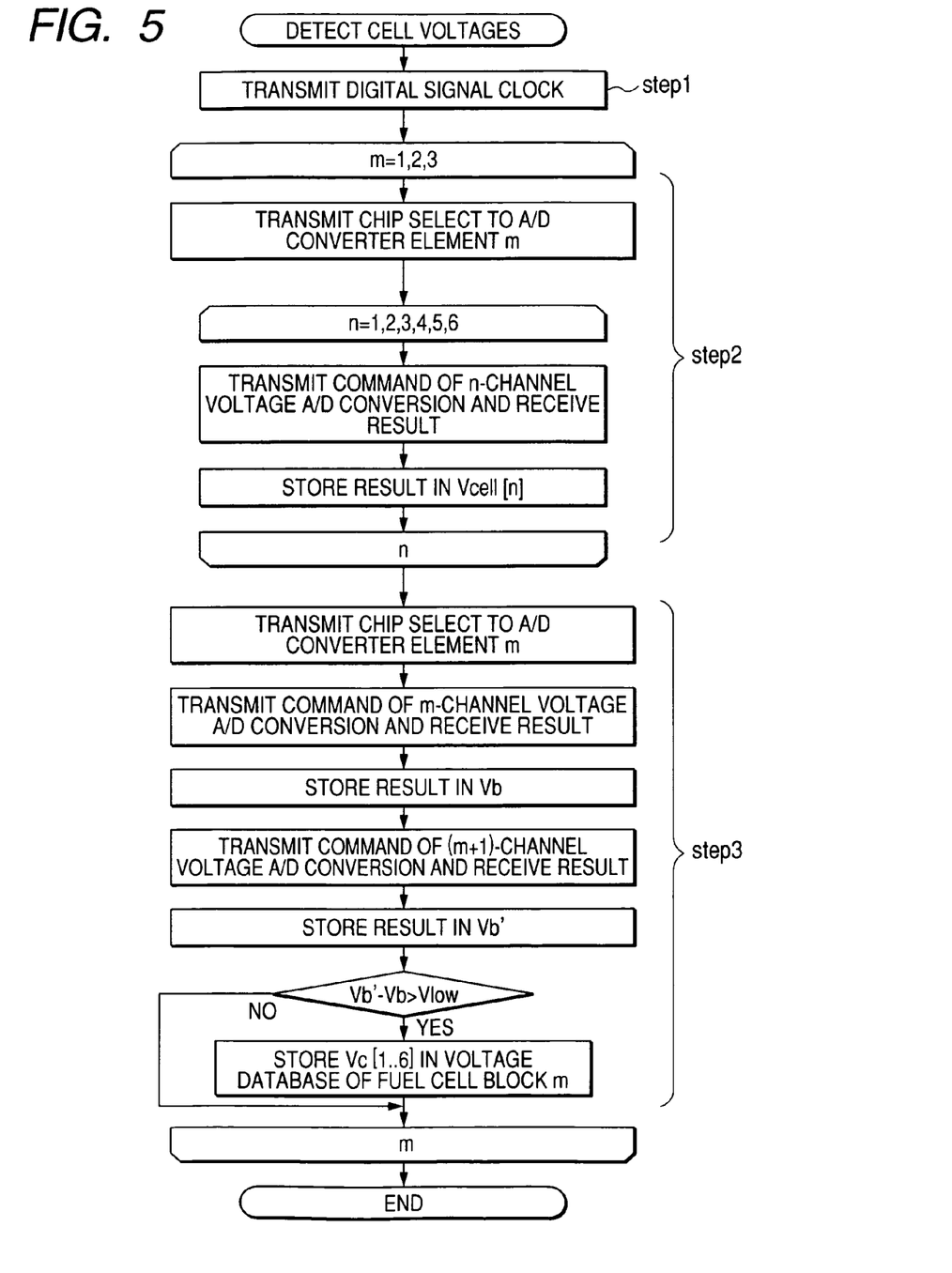
FIG. 5 is a diagram showing an example of the cell voltage detection flow in the cell voltage detection device according to Embodiment 1.

FIG. 5 shows an example of the flowchart of the cell voltage detection performed in the processor 5 according to the embodiment. First, in Step 1, the processor 5 generates a clock signal which is the reference of the A/D conversion and data communication. Subsequently, in Step 2, the processor 5 transmits the chip select output Do to the A/D converter element as the predetermined voltage detection means A, transmitting commands and receiving results so as to detect potentials of all the analog input channels of the selected A/D converter element, and temporarily storing the obtained results in a voltage data array Vcell [1 . . . 6]. Next, in Step 3, the processor 5 transmits the chip select output Do to the A/D converter element 2z, transmitting a command and receiving a result so as to detect potentials at the both ends of the temporarily stored operating power source of the A/D converter element. The processor 5 obtains the operating power source voltage of the A/D converter element from the difference of the both end potentials obtained herein. When the operating power source voltage of the A/D converter element is higher than a predetermined voltage threshold Vlow, the processor 5 determines that the voltage data array Vcell [1 . . . 6] having been temporarily stored is true, and performs normal processing, such as an update of a predetermined database as new data. When the operating power source voltage of the A/D converter element is below the predetermined voltage threshold Vlow, the processor 5 determines that the operating power source of the A/D converter element decreases during the detection of the voltage data array Vcell [1 . . . 6] having been temporarily stored and that abnormality is included in the A/D conversion result data. Then, the processor 5 ignores the temporarily stored voltage data Vcell [1 . . . 6] or performs anomaly processing, such as a correction of data, to avoid a false detection of the voltage. In this flow, Step 2 and Step 3 are repeated by changing the fuel cell block to which the chip select is transmitted in Step 2. The flow ends when all the fuel cell blocks forming the fuel cell stack 1 are detected.

As described above, in the embodiment, it is possible to detect the false detection of the A/D converter element due to the voltage reduction of the fuel cell, by measuring the both end voltages of the fuel cell blocks 1a, 1b, 1c which are the operating power source of the voltage detection element A, using the A/D converter element 2z as the voltage detection element B with the less variable constant voltage source 4 connected thereto, in addition to the A/D converter elements 2a, 2b, 2c as the voltage detection element A, which are powered by the voltage within each of the fuel cell blocks connected thereto.

Embodiment 2

Figure 6:
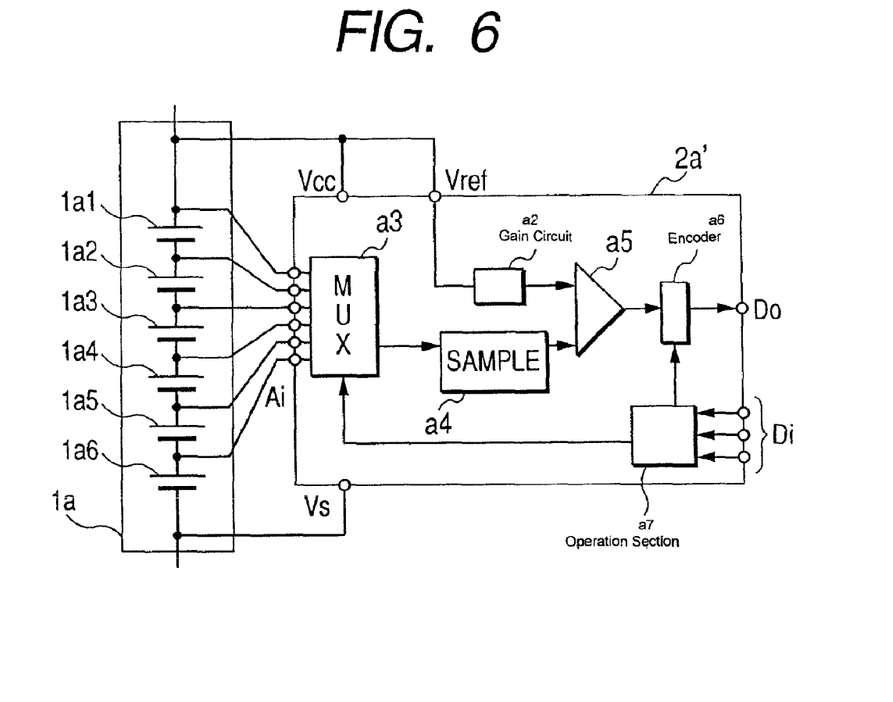
FIG. 6 is a diagram showing an example of the inside of an A/D converter element in a cell voltage detection device according to Embodiment 2.

The embodiment will be described with reference to FIG. 6. The same reference numerals are given to the components having the same functions as in Embodiment 1, and the detailed description thereof will be omitted. In the embodiment, as shown in FIG. 6, the maximum potential of each fuel cell block is connected to the reference voltage terminal Vref of the A/D converter element provided in the each fuel cell block. With such a configuration, the digital value of the cell voltage obtained from the A/D converter element 2a outputs a relative value of the voltage of the analog input terminal Ai relative to the both end voltage of the fuel cell block 1a to be measured.

Similarly to Embodiment 1, as the absolute value of the both end voltage of the fuel cell block 1a is measured by the A/D converter element 2z, for example, the voltage of the fuel cell 1a1 can be detected by multiplying the absolute value detected in the A/D converter element 2z, by the relative value of the fuel cell 1a1 within the fuel cell block 1a detected in the A/D converter element 2a. The multiplication can be performed in the operation of the processor 5.

With such a configuration, it is possible to detect the voltage values of the fuel cells for each of the A/D converter elements 2a, 2b, 2c as the voltage detection element A, without using the reference voltage Vref. This makes it possible to reduce the functions of the A/D converter element peripheral circuit.

Embodiment 3

The embodiment will be described with reference to FIG. 7. In an enclosure M11 of a fuel cell module shown in FIG. 7, a fuel cell stack M1 formed by laminating a plurality of fuel cells, a booster converter M2, and a cell state monitoring board M3 are housed. The outer surface of the enclosure M11 is provided with a terminal block M13 and a communication connector M12. A light-emitting diode (LED) or liquid crystal panel for displaying the state of the fuel cell module may be mounted to the outer surface of the enclosure M11. Further, connected to the enclosure M11 are: fuel supply means M8i for circulating the hydrogen-rich gas to be the fuel gas of the fuel cell stack M1; exhaust gas discharge means M8o for discharging the exhaust gas after hydrogen, which is a part of the hydrogen-rich gas supplied from the fuel supply means M8i, is consumed in the fuel cell stack M1; and heat carrier supply means M9i and heat carrier discharge means M9o for circulating the heat carrier for cooling the heat of the fuel cell stack M1. In this way, a grid connection is provided to the fuel gas system and heat transmission system outside the enclosure M11.

Figure 8:
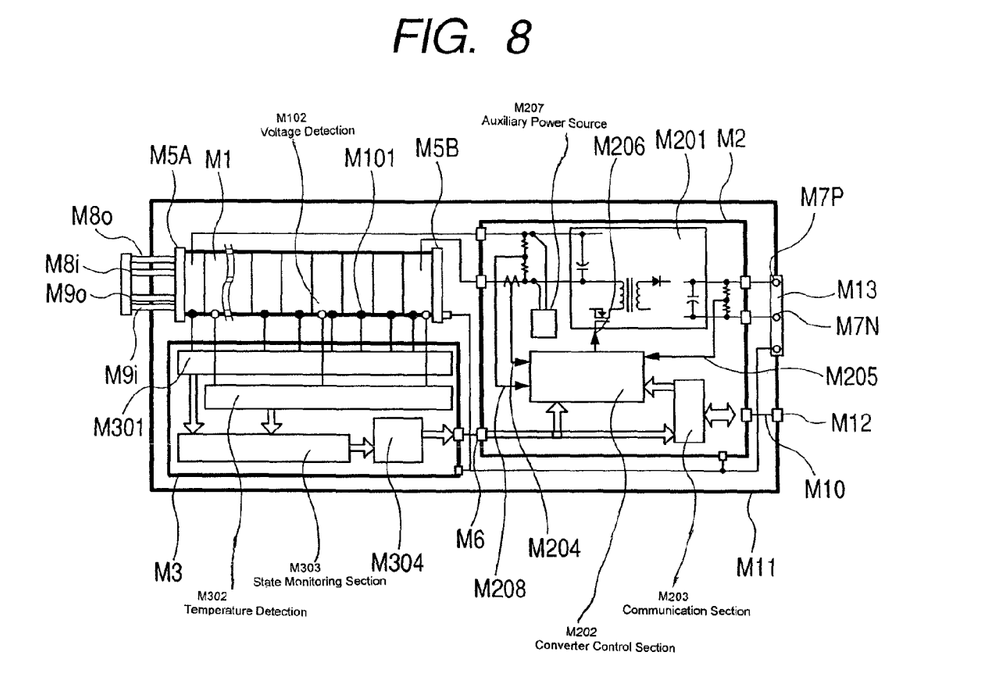
FIG. 8 is a diagram showing an example of the detailed configuration of the fuel cell module according to Embodiment 3.

FIG. 8 shows the system configuration of the fuel cell module housed in the enclosure M11. The booster converter M2 is electrically connected to the cells at the both ends of the fuel cell stack M1. Of the fuel cell stack M1, some or all of the cells each have a voltage detection terminal M101 which is electrically connected to a cell voltage detection section M301 within the cell state monitoring board M3. Similarly, the fuel cell stack M1 has a temperature detector M102 which is connected to a stack temperature detection section M302 within the cell state monitoring board M3.

Based on the information about the cell voltage and stack temperature obtained in the cell voltage detection section M301 and the stack temperature detection section M302, the stack state monitoring section M303 within the cell state monitoring board M3 performs an abnormality diagnosis for diagnosing whether the fuel cell stack M1 is normal or abnormal, and an optimal current command calculation for calculating the optimal current command value suitable for the user's application. The abnormality diagnosis result and optimal current command value obtained in the stack state monitoring section M303 are transmitted to the booster converter M2 through a communication section M304 within the cell state monitoring board M3 and through a connection cable M6.

Inside the booster converter M2, there are provided a converter main circuit M201, a converter control section M202, a communication section M203, and an auxiliary power source M207. The converter control section M202 calculates a converter control pulse M206, based on the information about the optimal current command value obtained through the connection cable M6, converter input voltage detection value M208, converter input current detection value M204, and converter output voltage M205. Then, the converter control section M202 outputs the pulse to a semiconductor switching element within the converter main circuit M201.

The communication section M203 transmits the information of the abnormality diagnosis result obtained through the connection cable M6 to the outside of the enclosure M11 via a connection cable M10 and a communication connector M12, by a predetermined communication method, for example, digital or analog communication. The auxiliary power source M207, when the both end voltage of the fuel cell stack M1 is more than a predetermined threshold V1, converts a part of the generated power of the fuel cell stack M1 to supply power with a predetermined voltage, such as DC 5V, 12V or 15V, which is consumed in the electrical circuit elements forming the booster converter M2 and the cell state monitoring board M3. Here, a constant voltage source 7 in the cell voltage detection device may be formed from the auxiliary power source M207. Further, a backflow prevention diode for preventing the electric current from flowing into a capacitor, not shown in the figure, via the terminal block from the outside, may be provided on a connection line extending between the terminal block M13 and the capacitor provided in an output end of the converter main circuit M201.

Figure 7:
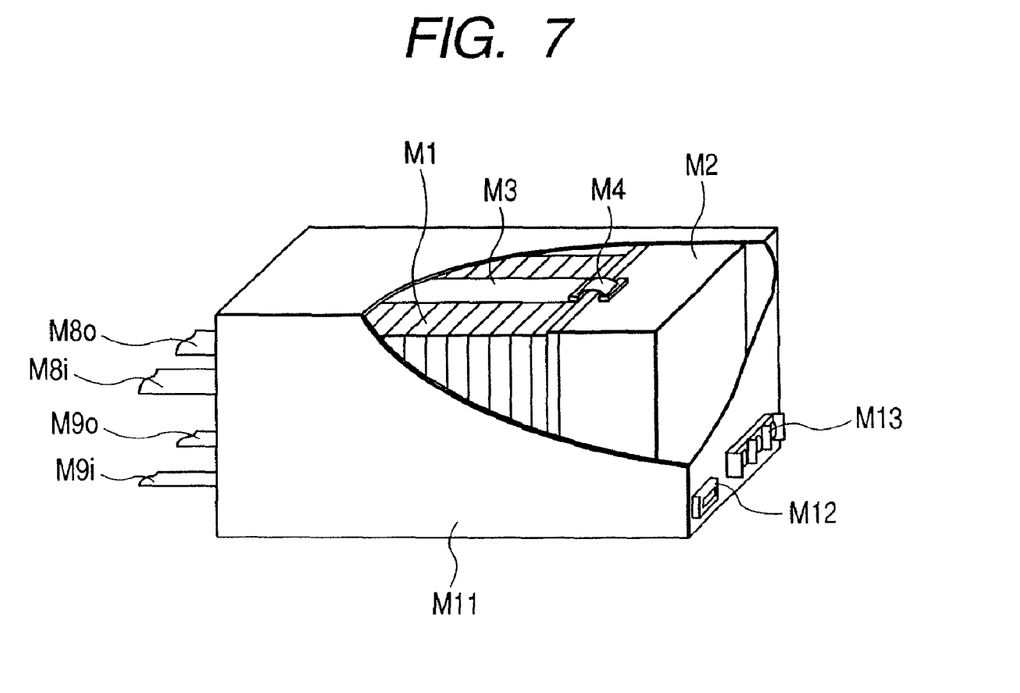
FIG. 7 is a view showing the outline of a fuel cell module according to Embodiment 3.

In FIGS. 7 and 8, as separate functions are assigned to separate portions, there are shown the booster converter 2 and the cell state monitoring board 3 as separate blocks. However, the booster converter 2 and the cell state monitoring board 3 may be placed on the same block, for example, on the same board, according to the configuration of the inside of the fuel cell module. When the booster converter 2 and the cell state monitoring board 3 are placed on the same block, the connection cable 6 can be omitted.

Figure 9:
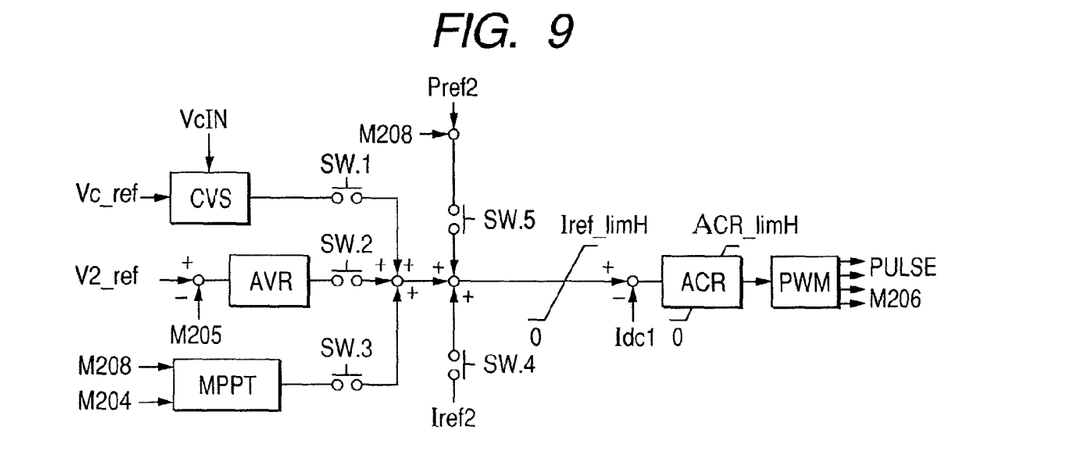
FIG. 9 is a diagram showing an example of a power generation control block of a fuel cell stack in the fuel cell module according to Embodiment 3.

FIG. 9 shows a diagram of a power generation control block of the fuel cell stack M1 including an optimal current command value calculation performed within the fuel cell module shown in FIGS. 7 and 8. First, a cell voltage stabilizing block CVS compares each cell voltage VcIN detected in the cell voltage detection section M301 to a reference value Vc_ref, determines as abnormal when the cell voltage decreases below the reference value Vc_ref, and narrows down the current command value. An output voltage control block AVR determines the current command value with the minimum difference between the converter output voltage detection value M205 and the predetermined converter output voltage command value V2_ref. A maximum power follow-up control block MPPT causes the current command value to follow a point where the generated power of the fuel cell stack is maximal, by slightly changing the current command value. These blocks calculate their desired current command values respectively. In addition to the current command values these blocks output, a current command value Iref2 or a power command value Pref2 can be input using the serial communication or analog command voltage from the outside of the fuel cell module. The user of the fuel cell module can select an actual current command value by a combination of selector switches SW1 to SW5, among the current command values obtained in the voltage stabilizing block CVS, output voltage control block AVR, and the maximum current follow-up control block MPPT, as well as the current command value input from the outside of the fuel cell module, depending on the desired operating condition. With the upper limit of the selected current command value set to Iref_limH and the lower limit restricted to 0, a predetermined modulating signal is obtained in a current control ACR where the difference between the current command value and the converter input current detection value M204 is minimum. The modulating signal is compared to a triangular wave carrier signal, and then the converter control pulse M206 is generated by a pulse width control PWM. Here, for example in the start-up or the stop sequence, the generation current of the fuel cell stack M1 is increased or reduced by adjusting the upper limit Iref_limH of the current command value. In this way the damage on the fuel cell stack M1 can be reduced by suppressing the rapid load change of the fuel cell stack M1. Further, setting the converter output voltage command value V2_ref to 300 to 400 V facilitates the connection with a grid connected inverter M407.

The fuel cell module as described above makes it possible to atomize the generation current adjustment based on the power generation characteristic know-how in the fuel cell, and to simplify the design of the power generation system using the fuel cell stack. In addition, it is possible to prevent a detection abnormality of the battery cell voltage within the fuel cell module, through the application of the voltage detection device according to the embodiment described in Embodiment 1, to the cell voltage detection section M102 and stack state monitoring section M303 of the fuel cell module.

Embodiment 4

Figure 10:
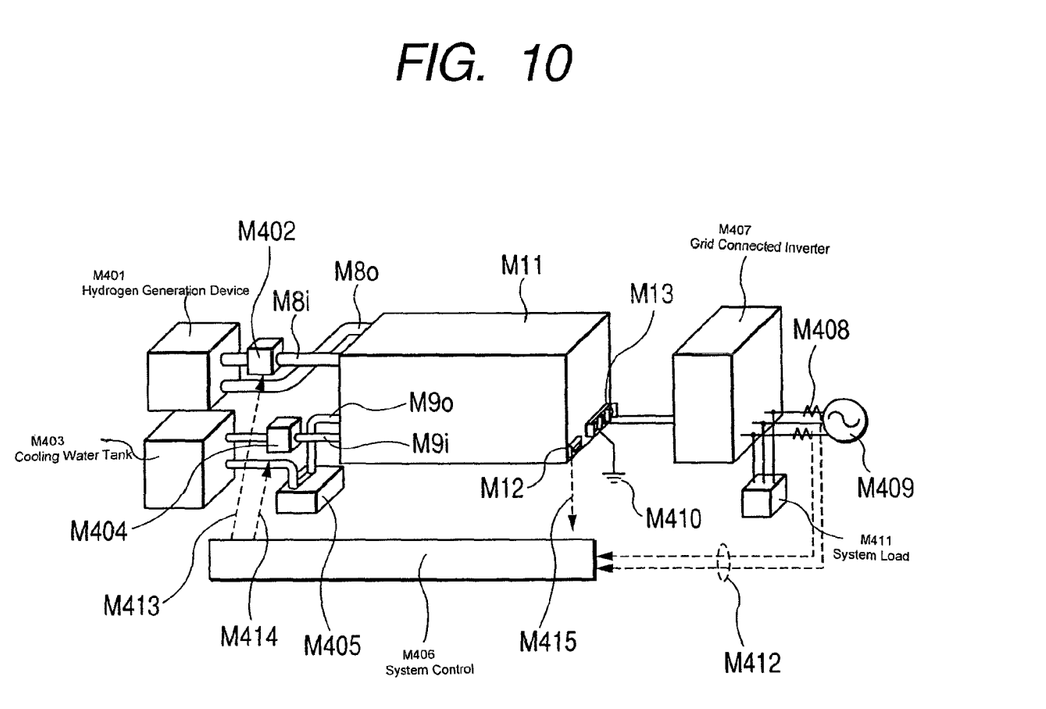
FIG. 10 is a view showing the outline of a power generation system according to Embodiment 4.

The embodiment will be described with reference to FIG. 10. The same reference numerals are given to the components having the same functions as in the above described Embodiment 3, and the detailed description thereof will be omitted. FIG. 10 shows a power generation system using a fuel cell module shown in the embodiment. The grid connected inverter M407 is electrically connected to electrodes M7P and M7N via the terminal block M13. The grid connected inverter M407 inverts the power generated in the terminal block M13 into an AC power having the voltage magnitude and frequency of a commercial AC power system M409. The AC power obtained by the inversion of the grid connected inverter M407 is supplied to the commercial AC power system M409 or to a system load M411. Further, an earth line M410 is connected to a predetermined earth terminal of the enclosure M11.

A hydrogen generation device M401 is a device for generating hydrogen-rich gas to be the fuel of the fuel cell stack M1, where a reformer that extracts hydrogen from city gas and kerosene or an electrolytic bath that applies electrolysis to water can be used. The hydrogen-rich gas generated in the hydrogen generation device M401 is fed to the fuel supply means M8$i$ by a fuel blower M402. The exhaust gas discharged from the exhaust gas discharge means M8$o$ is circulated to the hydrogen generation device, where hydrogen within the exhaust gas is collected or used for combustion. Cooling water to be the heat carrier for exchanging the heat generated in the fuel cell stack M1 is pooled in a cooling water tank M403. The cooling water is fed to the heat carrier supply means M9$i$ by a cooling water pump M404. Here, for example, cooling water with a high degree of purity is used. The cooling water after exchanging the heat of the fuel cell stack M1 is discharged from the heat carrier discharge means M9$o$, passes through a heat exchanger M405, and then is circulated to the cooling water tank M403.

A system control M406 issues a fuel blower flow rate command M413 and a cooling water pump command M414, while monitoring an incoming current value M412 detected by an incoming power sensor M408 provided between the commercial power system M409 and a connection point of the grid connected inverter M407 and the system load M411 as well as monitoring a module state signal M415 obtained from the communication connector M12 of the fuel cell module.

In the case of combining a plurality of fuel cell modules, for example, the communication of the module state signal M415 may be performed by enabling each of the fuel cell modules to select master or slave and thereby connecting the communication line to the system control M406 only from the fuel cell module having selected master.

The above described fuel cell system is a system that uses power by connecting the power generated by the fuel cell to the commercial power system, such as, for example, used in the home. It is possible to prevent the detection abnormality of the battery cell voltage in the fuel cell system, through the application of the fuel cell module having the cell voltage detection device according to the embodiment, to the power generation system using the fuel cell.

What is claimed is:

1. A cell voltage detection device comprising:
 a voltage detection element for detecting voltages of cells within a cell block formed with a plurality of cells serially connected to each other; and
 another voltage detection element for detecting a voltage of an operating power source of the voltage detection element,
 wherein the operating power source of said voltage detection element is supplied from a voltage of the inside or both ends of said cell block,
 wherein an operating power source of said another voltage detection element is supplied from a power source outside of said cell block,
 the operating power source of said another voltage detection element being less variable than the operating power source of said voltage detection element.

2. The cell voltage detection device according to claim 1 further comprising a cell stack formed with the plurality of cell blocks serially connected to each other,
 wherein the operating power source of said another voltage detection element is a series connection of cells including at least one of said cell blocks within said cell stack formed with the plurality of cell blocks serially connected to each other.

3. The fuel voltage detection device according to claim 1, wherein said voltage detection element and said another voltage detection element are semiconductor elements having an analog-digital data conversion function.

4. The fuel voltage detection device according to claim 3, wherein said fuel voltage detection device comprises insulation means for insulating said voltage detection element from the potential of the digital signal of said another voltage detection element,
 wherein a digital data bus that said voltage detection element has is connected in parallel to a digital data bus that said another voltage detection element has, via the insulation means,
 thereby to make said voltage detection element compatible with the digital communication protocol of said another voltage detection element.

5. The fuel voltage detection device according to claim 3, wherein said fuel voltage detection device comprises a processor element for performing communication and data storage,
 wherein the processor element performs digital data communication with said voltage detection element and said another voltage detection element.

6. The fuel voltage detection device according to claim 5, wherein said fuel voltage detection device is configured such that a ground potential of the operating power source of said voltage detection element and a ground potential of said processor element are common to each other.

7. The fuel voltage detection device according to claim 3, wherein said voltage detection element comprises an analog-digital conversion reference voltage and a ground terminal,
 wherein said reference voltage is connected with a maximum potential of said cell block that said voltage detection element connects to, and said ground terminal is connected with a minimum potential of said cell block that said voltage detection element connects to, respectively.

8. The fuel voltage detection device according to claim 7, wherein said fuel voltage detection device detects the cell voltage based on a cell voltage detection algorithm including multiplication of a digital output value of said voltage detection element and a digital output value of said another voltage detection element.

9. The fuel voltage detection device according to claim 1, wherein said fuel voltage detection device:
 determines a target cell to measure voltages,
 measures the potential difference between the both ends of the target cell by said voltage detection element connected to the target cell, measures the potential difference between the both ends of the operating power source of said voltage detection element by said another voltage detection element, when the potential difference measured by said another voltage detection element is more than a predetermined voltage threshold, performs normal processing of the potential difference measurement value between the both ends of said target cell, and when the potential difference measured by said another voltage detection element is less than the predetermined voltage threshold, performs anomaly processing of the potential deference measurement value between the both ends of said target cell.

10. A fuel voltage detection device comprising a plurality of cell submodules and a processor element, wherein:

each cell submodule includes a cell block formed with a plurality of cells serially connected to each other and insulation type communication means comprised of at least one of an optical coupler and a magnetic coupler, wherein the insulation type communication means is located between the cell submodules and the processor element;

minimum potentials of different ones of said cell blocks within said plurality of cell submodules are different from each other; and measurement of potentials at both ends of said cell blocks, electrical communication between the cell blocks of the cell submodules and the processor element through said insulation type communication means, and driving of said processor element are carried out by the use of a common constant voltage source coupled to the cell blocks, the insulation type communication means and the processor element.

11. The fuel voltage detection device according to claim 10, further comprising:

a voltage detection element for detecting voltages of cells within the cell block; and another voltage detection element for detecting a voltage of the operating power source of the voltage detection element, wherein an operating power source of said voltage detection element is supplied from a voltage of the inside or both ends of said cell block, wherein an operating power source of said another voltage detection element is supplied from the common constant voltage source located outside of said cell blocks, and wherein the common constant voltage source of said another voltage detection element is less variable than the operating power source of said voltage detection element.

12. A fuel voltage detection device comprising:

a voltage detection element for detecting voltages of fuel cells within a fuel cell block formed with a plurality of fuel cells serially connected to each other; and another voltage detection element for detecting a voltage of the operating power source of the voltage detection element, wherein the operating power source of said voltage detection element is supplied from a voltage of the inside or both ends of said fuel cell block, the operating power source of said another voltage detection element is supplied from a voltage source outside of said fuel cell block, and the operating power source of said another voltage detection element being less variable than the operating power source of said voltage detection element.

13. The fuel voltage detection device according to claim 12, wherein said plurality of fuel cells are polymer electrolyte fuel cells.

* * * * *